United States Patent [19]

Launzel et al.

[11] 4,179,733

[45] Dec. 18, 1979

[54] COMPUTER FOR CONTROL OF COMMUNICATION SIGNALS

[75] Inventors: Edward A. Launzel, 1501 Broadway, New York, N.Y. 10036; Gordon Silverman, New York, N.Y.

[73] Assignee: Edward A. Launzel, New York, N.Y.

[21] Appl. No.: 827,608

[22] Filed: Aug. 25, 1977

[51] Int. Cl.² .............................................. G06F 3/02
[52] U.S. Cl. .................................................. 364/200
[58] Field of Search ... 364/200 MS File, 900 MS File; 179/15, 18

[56] References Cited

U.S. PATENT DOCUMENTS

| | | | |
|---|---|---|---|
| 3,566,362 | 2/1971 | Taylor | 364/200 |
| 3,806,882 | 4/1974 | Clarke | 364/200 |
| 3,808,409 | 4/1974 | Enns | 364/200 X |
| 3,984,637 | 10/1976 | Caudill et al. | 364/200 X |

Primary Examiner—Harvey E. Springborn

[57] ABSTRACT

An electronic computer controls the operation of a communication system such as a citizen band (CB) radio. An electronic computer includes a program memory which stores the control sequence and code for an electronic lock. The computer also includes a data memory for storing command and data signals from a keyboard through a set of input/output registers and intermediate results from computer computations. Other elements of the computer may be a timer, an accumulator and logic unit (ALU) and set of working registers. A digital to analog converter converts an appropriate binary output from the computer into a voltage which is used as a reference for the communication system power supply providing control for this device. A second binary output from the computer provides for the control of the frequency signal channel over which the communications system is to transmit.

4 Claims, 8 Drawing Figures

COMPUTER FOR CONTROL OF COMMUNICATION SIGNALS

BACKGROUND OF THE INVENTION

This invention relates to the field of electronic computers and communication systems in combination. It is of a type which will prevent the unauthorized use of the communication system unless and until an appropriate code sequence is entered. Once the combination or code has been properly entered, the computer enables the user to select or change the channel (frequency) on which the communication proceeds. This instrument is particularly useful for mobile communication transmitter/receivers commonly referred to as citizen band (CB) radios.

In the past, there have been a variety of devices to prevent unauthorized use of communication systems. These devices have uniformly failed to adequately deter unauthorized use of such systems.

While these devices have included a lock, the lock has not included structures herein provided to control the time element and number of trials for arriving at the right combination by unauthorized persons. Moreover, additional control over other operating characteristics such as the transmitter frequency has not been included in prior art systems.

SUMMARY OF THE INVENTION

This invention relates to a device which controls the access of users to a communication system and when they have properly gained such access, allows them to select or change the operating frequency of the system.

It is among the principal objects of this invention to provide improved means for securing a communications system from use by unauthorized persons.

Another object of the invention resides in provision for improved means for selecting the operating frequency of a communication system.

A further object of the invention lies in its ability to limit the number of trials a person may try a combination to a lock before a period of enforced waiting is introduced.

Another object of the invention lies in its ability to limit the time a person may try to open a combination lock before a period of enforced waiting is introduced.

A further object of the invention lies in its improved means for supplying power to a communications system so that only an appropriate signal will enable the communications system.

These objects and other incidental ends and advantages of the invention will appear in the progress of the disclosure and as pointed out in the appended claims.

DRAWINGS OF PREFERRED EMBODIMENT

In the accompanying drawings showing a preferred form of the invention:

Figure 3A:
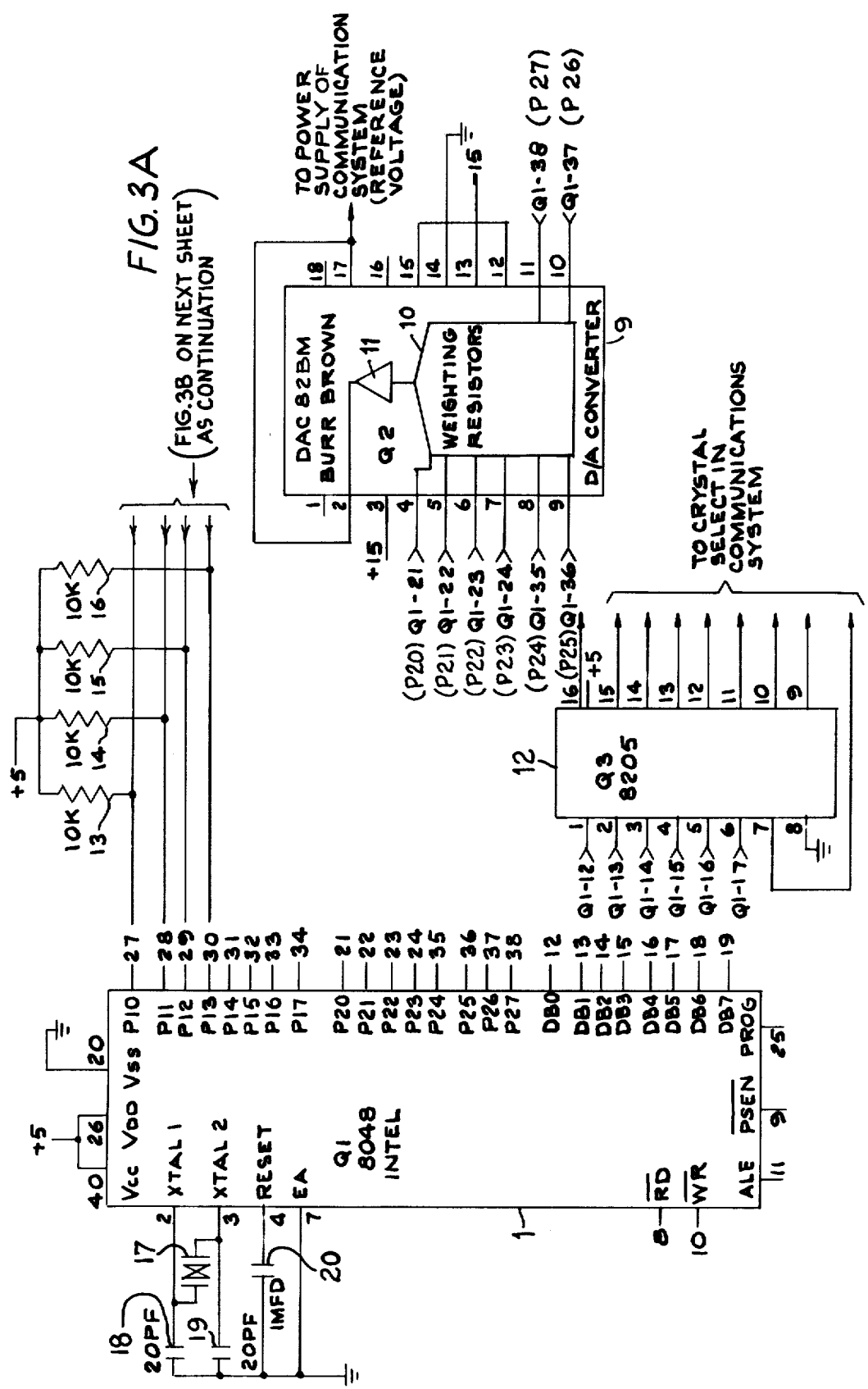
Figure 3B:
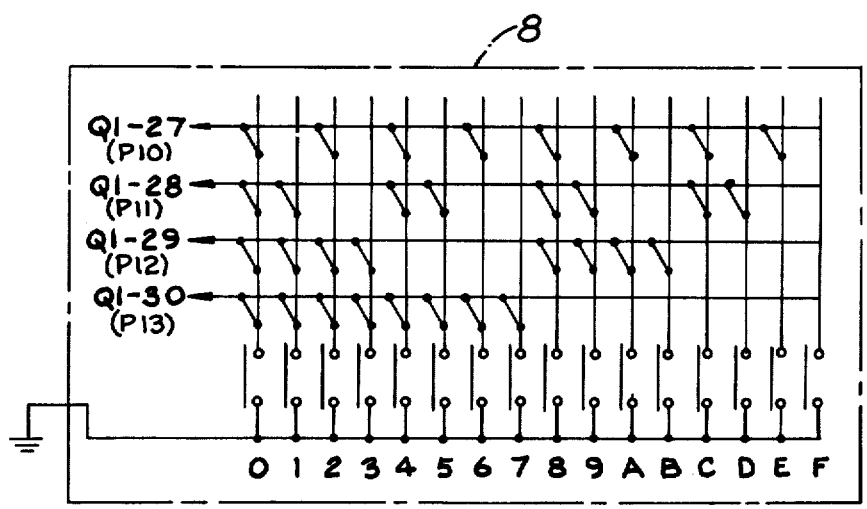

FIGS. 3A and 3B are schematic wiring diagrams of the microcomputer, D/A converter, decoder and keyboard [latter is FIG. 3B]. In FIG. 3A, all references to symbol Q1 apply to reference numeral 1 in said FIG. 3A while the numerals following the symbol Q1 refer to reference numeral 1 also in said FIG. 3A. On FIG. 3B, symbols (P10)–(P13) are intended to show equivalence to symbols Q1-27–Q1-30 respectively.

DESCRIPTION OF PREFERRED EMBODIMENT

Figure 1:
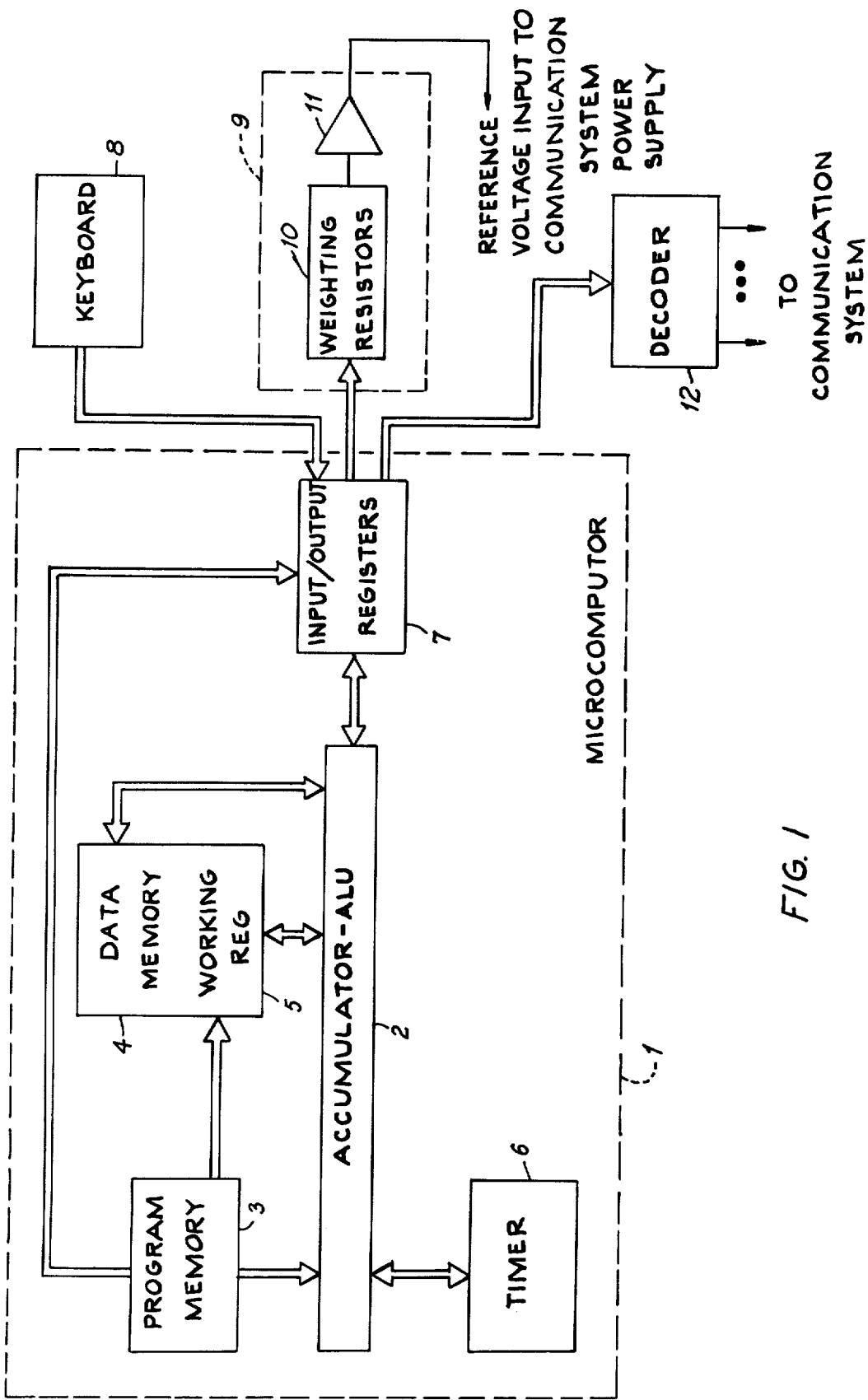
FIG. 1 is a schematic diagram of the entire system showing a microcomputing element, a keyboard for transmission of command signals and data signals, a D/A converter, a decoder and crystal selection element in combination.

As seen in FIG. 1 the device includes as part thereof a microcomputer indicated by numeral 1. The microcomputer can be a type 8048 manufactured by the Intel Corporation, 3065 Bowers Ave., Santa Clara, CA. 95051. It includes as part of the microcomputer: an accumulator ALU 2 in which all computations takes place, a program memory 3 in which the sequence of steps or operations carried out by the computer are stored, a data memory 4 in which commands, data and other information are stored, a set of registers designated as working register 5 in which partial computational results and other data are stored, a timer 6 which is used to measure elapsed time when used in combination with the other elements, and a multiplicity of input/output registers 7 which provides means for transmitting and receiving signals between the microcomputer and other elements of the device. The microcomputer 1 accepts signals (including commands and data) from the keyboard 8 via one of the multiplicity of input/output registers 7. When an appropriate sequence of commands and data have been transmitted from the keyboard to the microcomputer 1 within an elapsed time as determined by timer 6 (in combination with other elements of the microcomputer 1), a coded binary signal is transmitted to the D/A converter 9 (digital to analog converter). The D/A converter 9 includes a set of weighting resistors 10 which combine the signals being transmitted by microcomputer 1. The combination of binary signals and weighting resistors 10 produce a unique voltage at the input to operational amplifier 11. This voltage is amplified in operational amplifier 11 and transmitted to the power supply of the communications system. Without this voltage the power supply of the communication system (and hence the communication system itself) can be made inoperative. Without knowing the binary code and the exact voltage, unauthorized access to the communication system is not possible. Moreover, the binary code will not appear at the input to D/A converter 9 unless an appropriate sequence has been entered from keyboard 8 to the microcomputer 1. When this sequence is appropriate, the microcomputer provides the correct code to D/A converter 9 and allows the user to provide additional sequences from keyboard 8 which determines the frequency (or channel number) over which the communication system is to operate. This frequency may be repeatedly changed with appropriate entries via the keyboard 8. To select a particular frequency, the microcomputer 1 transmits signals to the decoder 12. These signals are binary coded signals which provides for 256 possible unique communication frequencies. The decoder 12 accepts the binary coded signals and provides one of the 256 possible combinations of binary bits on its 8 output lines. This output is transmitted to the communications system where it is used to engage a crystal appropriate to the desired communication frequency.

FIGS. 2A, 2B, 2C, 2D and 2E

The sequence of operations of the device (the program steps stored in program memory 3) is noted in FIGS. 2A, 2B, 2C, 2D and 2E. In the diagrams there shown, diamond shaped boxes with "?" marks represent decision points in the program. If the condition required by the decision is satisfied at the time it is encountered, then the next operation is the one encountered by following the arrow marked by a "Y". If the condition is not satisfied, the next instruction is that encountered by following the arrow marked "N". Rectangular symbols represent operations which are carried out by the microcomputer and its associated elements. Circular symbols represent continuation points in the program. That is, they represent the same point. If a circular symbol is encountered in a path, find another circular symbol with the same designation and continue at that point. An oval symbol represents a starting entry into the program either by virtue of initial application of microcomputer power, or because of signals produced by timer 6 or keyboard 8. These oval symbols will also be encountered when part of the program is ended at which point control returns to the portion of the program being executed at the time signals from timer 6 or keyboard 8 occurred. The sequence of operations follows the path defined by the arrows. Traversing the lines joining the various symbols by following directions designated by the arrowheads delineates the program.

Figure 2A:
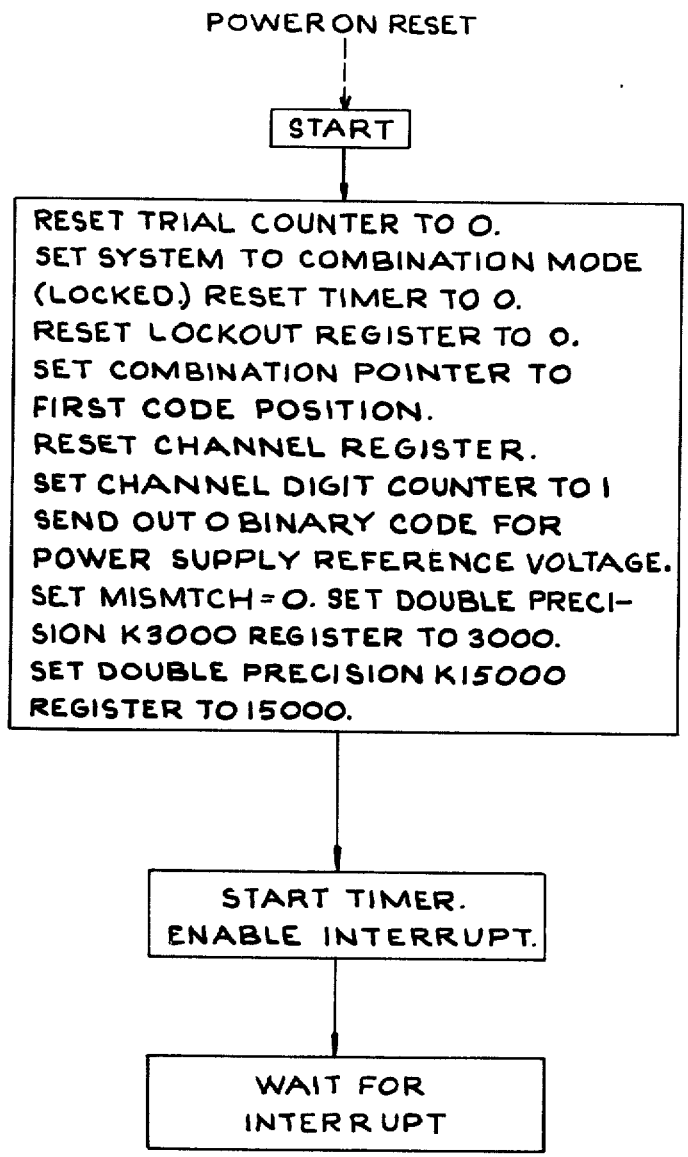
FIG. 2A is a sequence or flow diagram showing the sequence of steps that the microcomputer follows when power is first applied to the microcomputer element.

FIG. 2A indicates the program steps executed when power is first applied. The program begins at the oval marked "START". The microcomputer 1 is brought to that state by applying power to the microcomputer which induces a reset signal. The operations carried out in FIG. 2A are broadly called "initialization." The number of attempted trials is set to 0. The system is set to the clocked state. The timer is reset and started. It is also prepared to time out 1 minute. This is the time allowed to enter the correct combination. If the correct combination is not entered in 1 minute or if three unsuccessful combinations are entered the system "locks out" (ignores) further keyboard entries for 5 minutes so that further entries cannot be made for this period of time. After these aforementioned initializations the microcomputer interrupt system is enabled. This allows either keyboard entry or termination of a 20 millisecond time interval, as measured by timer 6, and causes the microcomputer to execute the programs shown in either FIG. 2C or FIG. 2B. As shown in FIG. 1A the microcomputer waits until an interrupt (keyboard or clock) occurs.

Figure 2B:
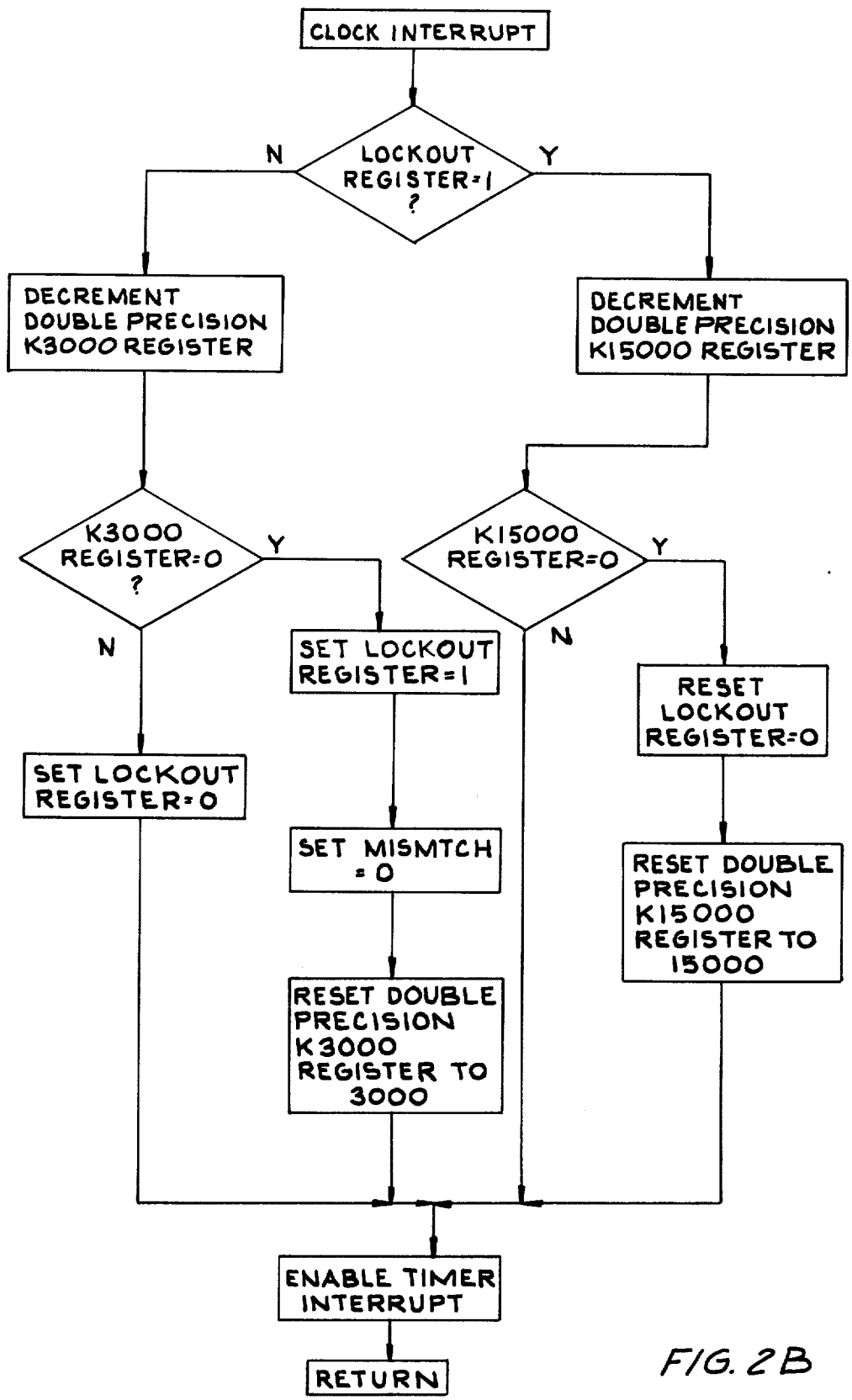
FIG. 2B is a sequence or flow diagram showing the sequence of steps that the microcomputer follows each time the clock element advances one time increment.

FIG. 2B indicates the sequence of operations executed when the clock interrupts the program. Two paths may be followed. If the device is not in the locked out state the computer decrements a register keeping track of each 20 millisecond clock interval. When 3000 of such intervals (1 SEC.) have elapsed the computer sets the system into the locked out mode (LOCKOUT REGISTER = 1). If 3000 intervals have not elapsed the program returns to wait for other interrupts. It will be subsequently apparent that successful combination entry will disable the timer as these time outs will no longer be necessary. If the device has already been locked out then a clock interrupt follows a different path. In this case the "Y" path is followed from the decision point "Lockout Reg. = 1?" In this event the microcomputer executes a program which counts 15000 of the 20 millisecond clock signals. Counting 15000 counts each of which occurs every 20 milliseconds will produce a time interval of 5 minutes. When 15000 counts have been recorded the Lockout Register is reset to 0 indicating that the keyboard can be used to transmit another combination.

Figure 2C:
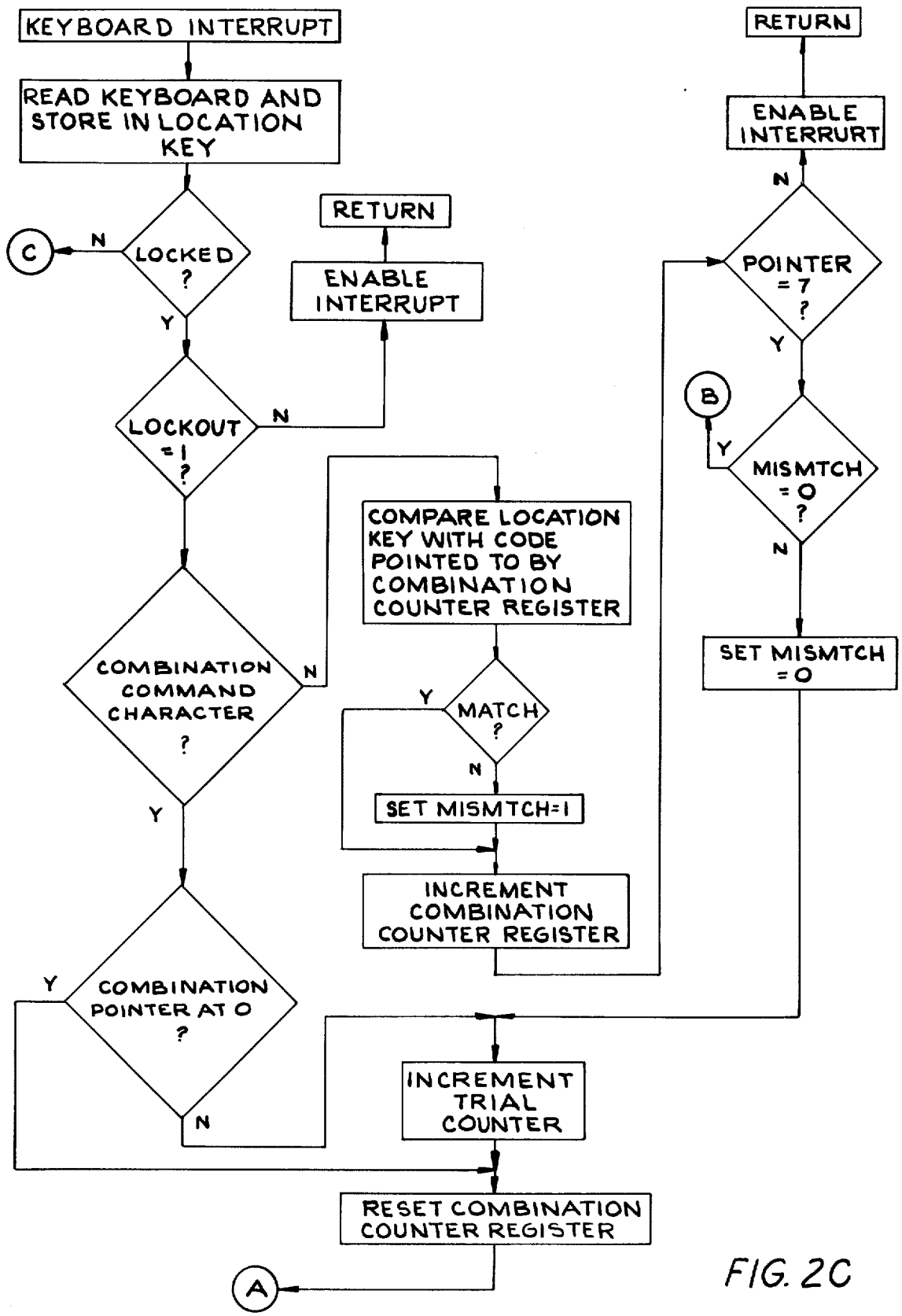
FIG. 2C is a sequence or flow diagram showing the sequence of steps that the microcomputer follows each time that an entry is made from the keyboard.

FIG. 2C delineates the program which is executed when the microcomputer receives an interrupt signal from the keyboard. The keyboard signal is first read and the command or data is stored in a location of data memory 4 which is labelled KEY. If the system has been previously unlocked, control is transferred to point C (see FIG. 2E). If the system is still locked however, the microcomputer determines if the device has been locked out by either of the previously mentioned faults (3 unsuccessful combinations or failure to open the lock in 1 minute). If the system has been previously locked out the program returns to its former state without further processing the keyboard signal. The keyboard is thus ignored. If the system has not been locked out the microcomputer examines the character which has been entered from the keyboard. The character may be a command character (combination command character) which the user transmits when ready to start the transmission of a combination. This may be done when power is first turned on or if the user realizes that an error has occurred while entering a combination. If an error has occurred while entering a combination and the user realizes this, he or she simply transmits a combination command character which resets a register (combination counter register) which is keeping track of where in the program memory 3 the computer must look to find the next code character. Before this combination counter reg. is reset the trial counter is incremented because the user has made an error and thus produced an unsuccessful trial. When this is complete, control is transferred to point A (see FIG. 2D). If the character entered from the keyboard is not a combination command character then program execution treats this signal as one of the combination characters. The contents of location KEY are compared to the contents of the memory location in program memory 3, being addressed by the combination counter reg. After this comparison, two outcomes are possible. If the two locations match, then location MISMTCH in data memory 4 is left alone as the combination is thus far correct. If the two locations disagree then location MISMTCH is set to 1. The combination counter reg. is incremented so that it now addresses the memory location in program memory 3 which stores the next character in the combination. If 7 characters have been transmitted and no mismatch has occurred (MISMTCH = 0) then control is transferred to point B in the program (see FIG. 2D). If 7 characters have been transmitted and a mismatch has occurred in one of the characters then MISMTCH would be found to be 1. Under these circumstances the trial counter is incremented (a faulty trial has occurred) and the combination counter reg. is set reset so that it addresses the location of the first combination character in program memory 3.

Figure 2D:
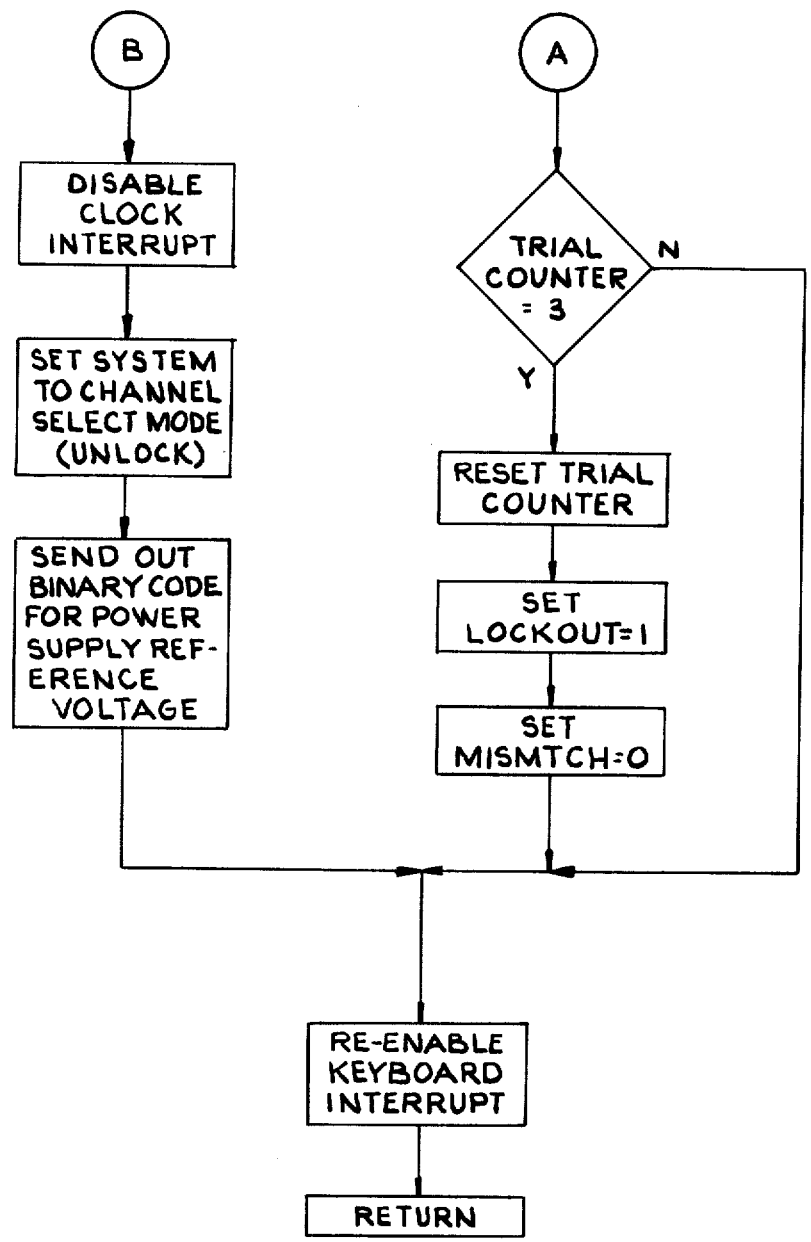
FIG. 2D is a sequence or flow diagram showing the sequence of steps that the microcomputer follows when the combination has been successfully entered and also the steps that the microcomputer follows when the combination has not been successfully entered.

FIG. 2D delineates what steps are executed when a correct combination of characters have been transmitted from the keyboard or what steps are executed when 3 unsuccessful trial combinations have occurred. The trial counter location is interrogated to see if it has reached a count of 3. If it has not, the keyboard interrupt is enabled once again and the control of the program is returned to its previous state (which is waiting for the next keyboard interrupt or the next timer interrupt). If, however, 3 unsuccessful trials have occurred, the location in data memory 4 which stores the number of trials is reset to 0 (to ready it for new trials) and the device is set into the lockout mode (LOCKOUT=1) where it ignores new keyboard entries for the next 5 minutes. Additionally, the location in data memory 4 keeping track of mismatches is reset to 0 (MISMTCH=0).

If a successful combination has been completely entered the control passes to point B on FIG. 2D. The timer is first disabled as it is no longer needed. The system is unlocked (set system to channel select mode). A binary code which is the digital equivalent of the power supply reference voltage is sent out to the input-/output registers 7 where these signals are subsequently transferred to D/A converter 9. The program now reenables the keyboard interrupt where it is ready to accept channel select commands.

Figure 2E:
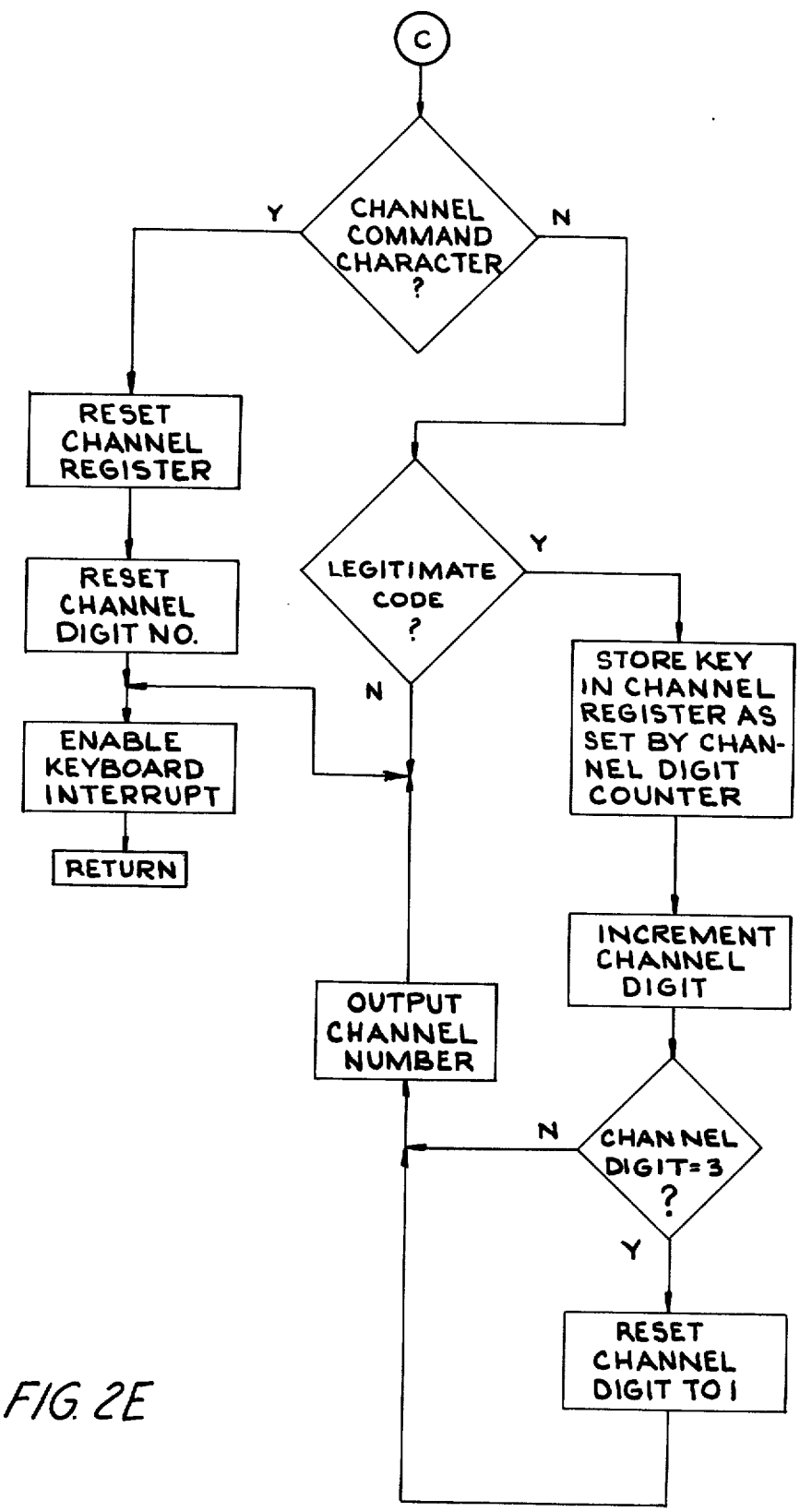
FIG. 2E is a sequence or flow diagram showing the sequence of steps that the microcomputer follows to enter or change the channel (frequency) on which the communication system operates.

FIG. 2E delineates the program steps which are executed once the proper combination has been entered. If the character being transmitted from the keyboard is a channel select command character then the register (in data memory 4) which keeps track of the communication system's operating channel (frequency) is reset to 0. As a legitimate channel has two digits associated with it, the presence of a channel select command will reset the channel digit to 1 making the device ready to receive the first digit of the channel number. If the code received from the keyboard is not a channel select command character the microcomputer first checks to see that the code transmitted is a number (and not a combination command character for example). If the character transmitted is not a legitimate character the microcomputer will ignore it and the device is made ready to receive the next keyboard signal. If the character is legitimate then the number is stored in that part of the channel register that is designated by the channel digit counter. The channel digit counter is incremented and tested to see if it equals 3. If it does then it means that the digit just stored in the channel register was the second and the digit counter is reset to 1 to ready it to change the channel number should that be desired. The channel register contents are transferred via input/output registers 7 to decoder 12. Decoder 12 enables an output corresponding to the binary coded signals it has received from input/out registers 7. Should it be desired to change the operating channel the procedure just described is repeated (assuming that the system is unlocked). That is, simply depress the channel command signal followed by the digits of the desired channel.

FIGS. 3A and 3B are schematic wiring diagrams of the microcomputer 1, keyboard 8, D/A converter 9 and decoder 12. For microcomputer 1 a crystal 17 establishes the frequency at which program steps internal to microcomputer 1 are carried out. Capacitor elements 18 and 19 are required to cause the microcomputer 1 to oscillate at the crystal 17 frequency. Capacitor 20 assures that when power is first applied the microcomputer will execute the program step found in location 0 of program memory 3. (This is equivalent to a reset of the microcomputer.) Keyboard 8 transmits a coded signal to microcomputer 1 on the microcomputer input lines P10, P11, P12 and P13 according to which one of the 16 keys of keyboard 8 are depressed. This code and their function is indicated in table 1. In this table a symbol 1 is equivalent to +5 volts and a symbol 0 is equivalent to 0 volts.

Table 1

| KEY DEPRESSED | P10 | P11 | P12 | 13 | MEANING |
|---|---|---|---|---|---|
| 0 | 0 | 0 | 0 | 0 | Digit 0 |
| 1 | 1 | 0 | 0 | 0 | Digit 1 |
| 2 | 0 | 1 | 0 | 0 | Digit 2 |
| 3 | 1 | 1 | 0 | 0 | Digit 3 |
| 4 | 0 | 0 | 1 | 0 | Digit 4 |
| 5 | 1 | 0 | 1 | 0 | Digit 5 |
| 6 | 0 | 1 | 1 | 0 | Digit 6 |
| 7 | 1 | 1 | 1 | 0 | Digit 7 |
| 8 | 0 | 0 | 0 | 1 | Digit 8 |
| 9 | 1 | 0 | 0 | 1 | Digit 9 |
| A | 0 | 1 | 0 | 1 | — |
| B | 1 | 1 | 0 | 1 | — |
| C | 0 | 0 | 1 | 1 | channel command |
| D | 1 | 0 | 1 | 1 | character |
| E | 0 | 1 | 1 | 1 | combination command |
| F | 1 | 1 | 1 | 1 | character |

Resistors 13, 14, 15 and 16 provide bias for keyboard 8. Weighting resistors 10 receive their inputs from signals P20 through P27 of microcomputer 1. The weighting resistors 10 supply a signal to operational amplifier 11. The output of operational amplifier 11 supplies the reference voltage for the power supply of the communications system. Decoder 12 receives its inputs from signals DB0 through DB5 of microcomputer 1. The code on these signal lines provide a signal on one of the lines going to the communications system which selects the frequency on which the communications system is to operate.

It is understood that minor changes and variations in the components of the apparatus, settings, circuitry and system may all be resorted to without departing from the spirit of the invention and the scope of the appended claims.

We claim:

1. A device for controlling a communication system having a sequence of operation, said device comprising:
program memory means including a plurality of previously stored sequences of binary qunatities for control of said sequence of operation of said device;
accumulator-ALU means connected to said program memory means wherein both calculations and comparisons of binary quantities occur;
data memory means connected to said accumulator-ALU and to said program memory means wherein results of said both calculations and comparisons are stored as an independent and a second sequence of binary quantities;
timer means connected to said accumulator-ALU means wherein signals are produced at a fixed predetermined rate;

input/output register means having a multiplicity of inputs and outputs connected to said accumulator-ALU means and to said program memory means wherein said plurality of previously stored sequences of binary quantities and said second sequence of binary quantities are transmitted between the said accumulator-ALU means and other elements of said device, such other elements including:

a. keyboard means connected to said input/output register means wherein a third sequence of binary quantities may be generated by a user for purpose of comparision with one of said plurality of previously stored sequences of binary quantities, such comparison being stored as part of said second sequence of binary quantities;

b. D/A converter means connected to one of said multiplicity of outputs of said input/output register means such that said second sequence of binary quantities produces a unique potential in said D/A converter means, such unique potential actuating said communication system;

c. decoder means connected to another of said multiplicity of outputs of said input/output register means such that said second sequence of binary quantities produces a predetermined voltage on one of a multiplicity of control lines, such predetermined voltage actuating the frequency at which said communication system is to operate.

2. A device as set forth in claim 1 wherein at least one sequence of said plurality of previously stored sequences of binary quantities corresponds to said third sequence of binary quantities for purposes of modifying said second sequence of binary quantities such that the unique potential produced in said D/A converter by said second sequence of binary quantities actuates the said communication system.

3. A device as set forth in claim 2 wherein said at least one sequence of said plurality of previously stored sequences of binary quantities and wherein said timer means includes limit means for matching against said limit means the timing of said third controlled sequence of binary quantities and for modifying said second sequence of binary quantities such that said modified said second sequence of binary quantities produces a second unique potential in said D/A converter means, such second unique potential deactuating said communication system.

4. A device as set forth in claim 3 wherein said limit means has a second time limiting means of execution operative when either said limit means for matching the timing of said third controlled sequence of binary quantities is exceeded or when four or more of said third sequences of binary quantities are generated without at least one of said third sequence of binary quantities corresponding to at least one sequence of said plurality of previously stored sequences of binary quantities for a different time interval relative to the timing of said third controlled sequence of binary quantities whereby another one of said plurality of previously stored sequences of binary quantities is used to modify said second sequence of binary quantities such that said modified second sequence of binary quantities produces a second unique potential in said D/A converter means, such second unique potential deactuating said communication system for said different time interval, and operative also for preventing another of said third sequence of binary quantities from being operational for a predetermined period of time.

* * * * *